United States Patent [19]

Earlie

[11] Patent Number: 5,097,468
[45] Date of Patent: Mar. 17, 1992

[54] TESTING ASYNCHRONOUS PROCESSES

[75] Inventor: Eugene Earlie, Northborough, Mass.

[73] Assignee: Digital Equipment Corporation, Maynard, Mass.

[21] Appl. No.: 189,773

[22] Filed: May 3, 1988

[51] Int. Cl.$^5$ .................. G06F 11/00; G01R 31/28
[52] U.S. Cl. .................. 371/15.1; 371/27; 371/61
[58] Field of Search .............. 371/15.1, 16.1, 22.1, 371/23, 27, 61; 324/158 R

[56] References Cited

U.S. PATENT DOCUMENTS

| | | | |
|---|---|---|---|
| 4,139,147 | 2/1979 | Franke | 371/25.1 |
| 4,477,902 | 10/1984 | Puri et al. | 371/25.1 |
| 4,622,669 | 11/1986 | Pri-Tal | 371/16.1 |
| 4,649,539 | 3/1987 | Crain et al. | 371/22.3 |
| 4,656,592 | 4/1987 | Spaanenburg et al. | 364/490 |

FOREIGN PATENT DOCUMENTS 1381413  5/1973  United Kingdom .

OTHER PUBLICATIONS

Chappell, "Automatic Test Generation for Asynchronous Digital Circuits" *Bell System Technical Journal,* vol. 53, No. 8, Oct. 1974, pp. 1477–1503.

Fujieda et al., "Testing Asynchronous Devices" *Digest of Papers: International Test Conference* 1987; IEEE Cat. No. 87CH2437-2, pp. 871–875.

*Primary Examiner*—Dale M. Shaw
*Assistant Examiner*—David Huntley
*Attorney, Agent, or Firm*—Fish & Richardson

[57] ABSTRACT

An asynchronous chip is tested functionally by clocking it at a rate slower than its specified rate while applying test vectors at times selected so that synchronized signals guaranteed on the chip will be predictable. Testing of the chip at the specified rate is accomplished on a section-by-section basis.

25 Claims, 7 Drawing Sheets

TESTING ASYNCHRONOUS PROCESSES

BACKGROUND OF THE INVENTION

This invention relates to testing asynchronous circuits.

Typical integrated circuit testers test chips of the kind that implement a single function cadenced at a single clock frequency. Some chips implement functions that involve signals clocked by two or more asynchronous clocks. For example, a chip that serves several processors requests for access to a single memory may communicate with the memory using signals based on one clock rate that is asynchronous with the clocks used for communication with the processors.

SUMMARY OF THE INVENTION

A general feature of the invention provides a method of testing a digital circuit (e.g., an integrated circuit) of a kind that is intended (a) to be clocked at least at one prespecified rate, (b) to receive input signals that are possibly unsynchronized with the clock, and (c) to generate corresponding signals that are synchronized with the clock, where the synchronized signals may be unpredictable. The testing includes clocking the digital circuit at a rate that is slower than the prespecified rate, and applying to the circuit test vectors corresponding to the input signals at times such that the synchronized signals will be predictable.

Another general feature of the invention provides a method of testing a digital circuit of a kind that is intended to be clocked at least at one prespecified rate, where the circuit includes signal paths each capable of receiving input signals and delivering corresponding output signals, and some of the signal paths produce unpredictable output signals when the digital circuit is clocked at the prespecified rate. The testing method includes clocking, at the prespecified rate, each signal path that is capable of being tested at the prespecified rate with predictable results, while applying to the terminals of the circuit a sequence of test vectors that is insufficient to fully test all functions of the circuit but is sufficient to test each signal path of the circuit.

Preferred embodiments of the invention include the following features.

Where the unpredictability of the synchronized signals arises from setup and hold time requirements of the circuit, the test vectors include signals whose timing is dependent on the set up and hold times. All of the test vectors are derived from a single prototype vector that defines the timing of all input signals relative to the clocking rate in such a way that the synchronized signals will all be predictable if the test vectors are delivered at a predetermined rate. Each test vector includes at least some input signals appearing at times defined by the prototype vector. During the test of a signal path at the predetermined rate, the rate may temporarily be slowed during one or more time segments, in some cases by suppressing a clock tick.

In cases where testing a signal path requires simultaneously exercising another signal path, the other signal path may be exercised at a rate slower than the prespecified rate. Where the signal paths are linked by a buffering circuit that enables one signal path to feed data to the buffer asynchronously with the rate at which data is retrieved from the buffer by the other signal path, the method includes controlling the slower rate relatively to the predetermined rate based on the characteristics of the buffer. For example, the buffer may be filled and emptied at unequal rates, or at equal rates, or alternately filled by one speed path at its full speed and emptied by the other speed path at its full speed. The slower rate may be slowed further in selected segments of the test to assure predictability The slower speed and the predetermined speed may be harmonically related.

There may be several synchronizers and the input signals for different synchronizers may be asynchronous with respect to one another.

Test vectors may be generated for use in performing the tests by (i) providing simulation models of the digital circuit and of testing elements for delivering and receiving test signals to and from the digital circuit, (ii) including, in the testing element models, algorithms for generating logical test pattern sequences, (iii) running the models through a sequence of testing intervals to generate traces that are convertible into test vectors, and (iv) selecting the rates at which the test models operate to assure the predictability of the test results. The test model rates may be varied while the models are being run. Any testing element model may request that the rate at which a test is running be temporarily slowed.

The invention enables complete testing of aysnchronous chips using a conventional tester Both the logical functions and the speed paths of the circuit are thoroughly tested Complex chips having multiple asynchronous processes can be tested. The speed path tests make use of already available FIFO buffers. The technique takes advantage of already available approaches to developing a test vector sequence, while solving the timing problems and unpredictability associated with testing asynchronous circuits.

Other features and advantages will become apparent from the following description of the preferred embodiment, and from the claims.

DESCRIPTION OF THE PREFERRED EMBODIMENTS

We first briefly describe the drawings.

STRUCTURE AND METHOD

Figure 1:
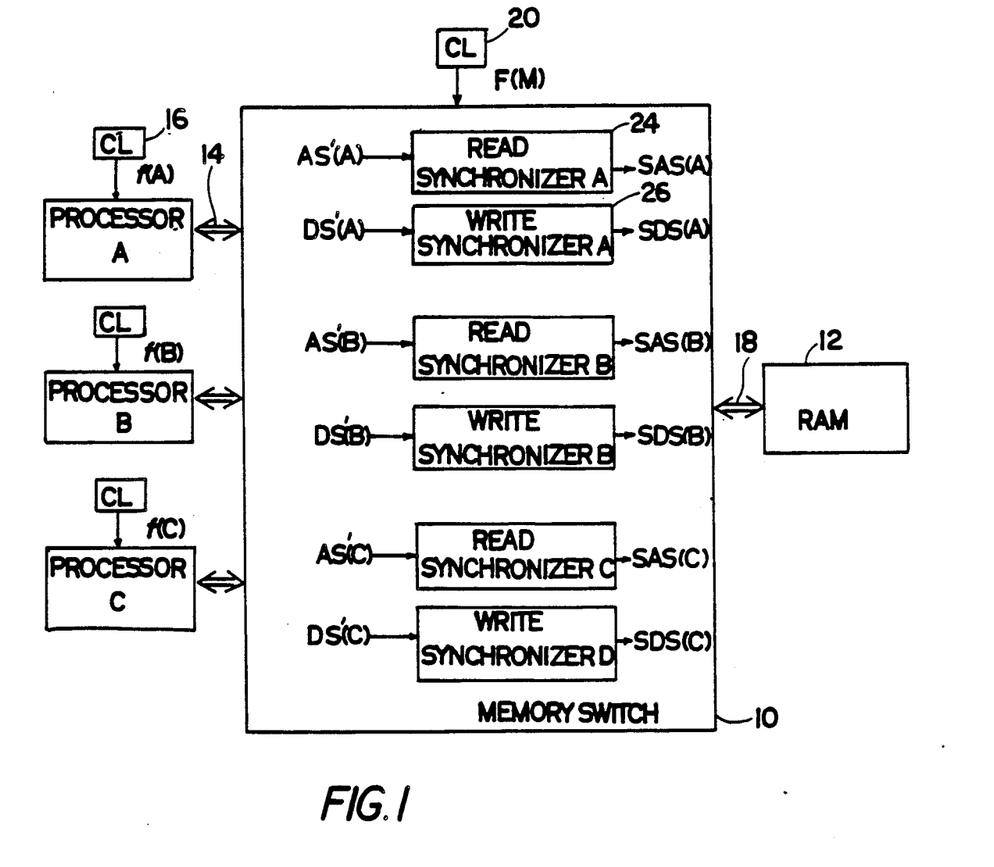
FIG. 1 is a block diagram of a memory switch and associated circuits.

Referring to FIG. 1, memory switch 10 is a simple example of an asynchronous chip to be tested. Memory switch 10 arbitrates among conflicting requests made by three independent processors A, B, and C for access to a shared RAM 12. Once a request has been granted, memory switch 10 provides a logical path for addresses and data between the processor and RAM 12.

Each processor is connected to memory switch 10 by a processor bus 14 which includes conventional address strobe (AS), data strobe (DS), write control (WR), and ready (RDY) lines, and a set of multiplexed address-/data (BUS) lines. Each processor has its own clock source 16 at a particular frequency, e.g., f(A); the three clocks operate asynchronously with possibly different frequencies. Each processor issues its output signals (AS, DS, WR, BUS) and strobes its input signals (RDY, BUS) at times based on its own clock.

Figure 2:
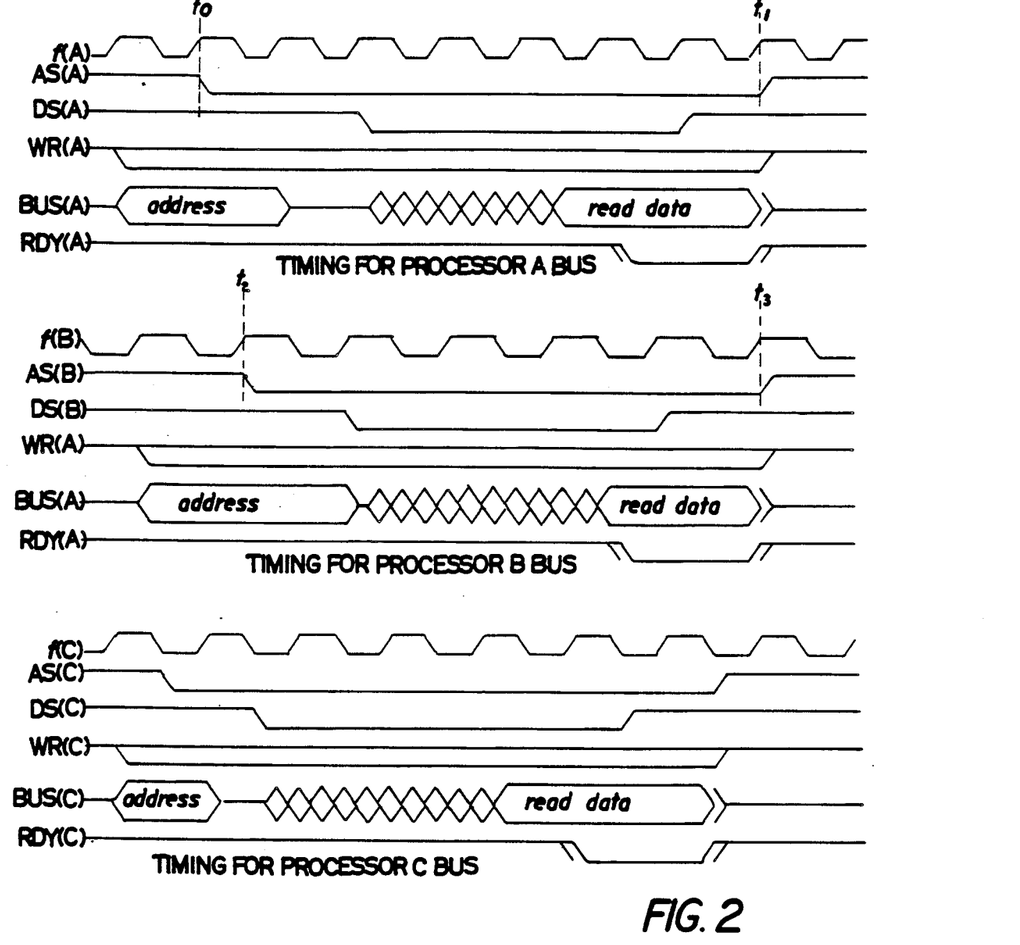
FIG. 2 is a timing diagram of signals on the lines of the processor A, B, and C buses of FIG. 1.

Referring to FIG. 2, for example, processors A, B, and C are shown as having three different clock frequencies as well as different specifications for the locations of the edges of their input and output signals. In processor A, for example, the address strobe, AS(A), appears beginning with a falling edge at the second rising clock edge (at time $t_0$) and ending with a falling edge at the seventh rising clock edge thereafter (at time $t_1$) In processor B, AS(B) also appears at the second rising clock edge ($t_2$) but ends at the fifth rising clock edge thereafter ($t_3$).

Referring again to FIG. 1, memory switch 10 communicates with RAM 12 via a memory bus 18, which includes conventional row address strobe (ras), column address strobe (cas), ram address (ram add), and ram data. Synchronized address strobe (SAS(X)) lines, are generated inside memory switch 10 where X denotes the processor whose request is being served.

Figure 3:
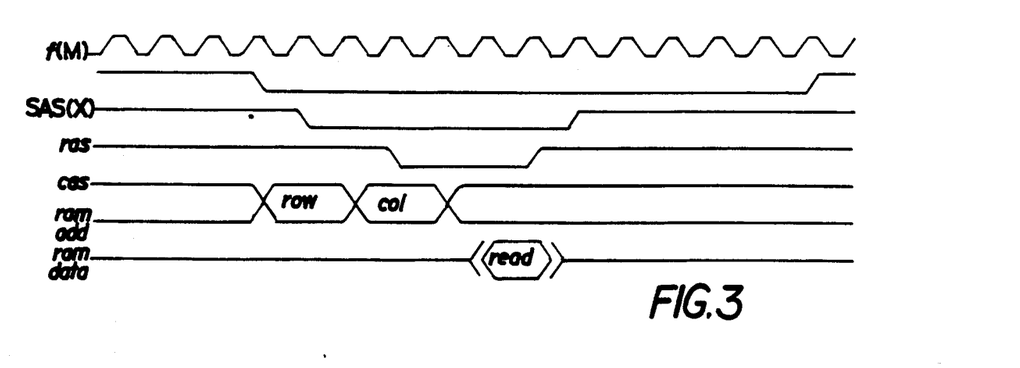
FIG. 3 is a timing diagram of signals on the lines of the memory bus of FIG. 1.

Referring to FIG. 3, the timing of the various signals on bus 18 and a representative SAS(X) signal are shown relative to the frequency f(M) of a clock source 20 associated with memory switch 10 (FIG. 1). Clock source 20 operates asynchronously (with possible different frequency) with respect to the clock sources 16 for processors A, B, and C Clock source 20 serves both as a timing reference to cadence the reading and writing of RAM 12 via bus 18 (as shown in FIG. 3) and to clock the internal logic of memory switch 10.

Requests from, e.g., processor A, to read or write in RAM 12 appear on the processor A bus 14 at times based on frequency f(A) (and therefore asynchronously from times at which memory switch 10 may be ready, based on its own clock f(M), to execute the read or write request). Accordingly memory switch 10 includes six synchronizers (FIG. 1) which accommodate the timing differences between the three processors and the memory switch. There are two synchronizers for each processor: one synchronizer 24 is for read requests; the other synchronizer 26 is for write requests.

Figure 4:
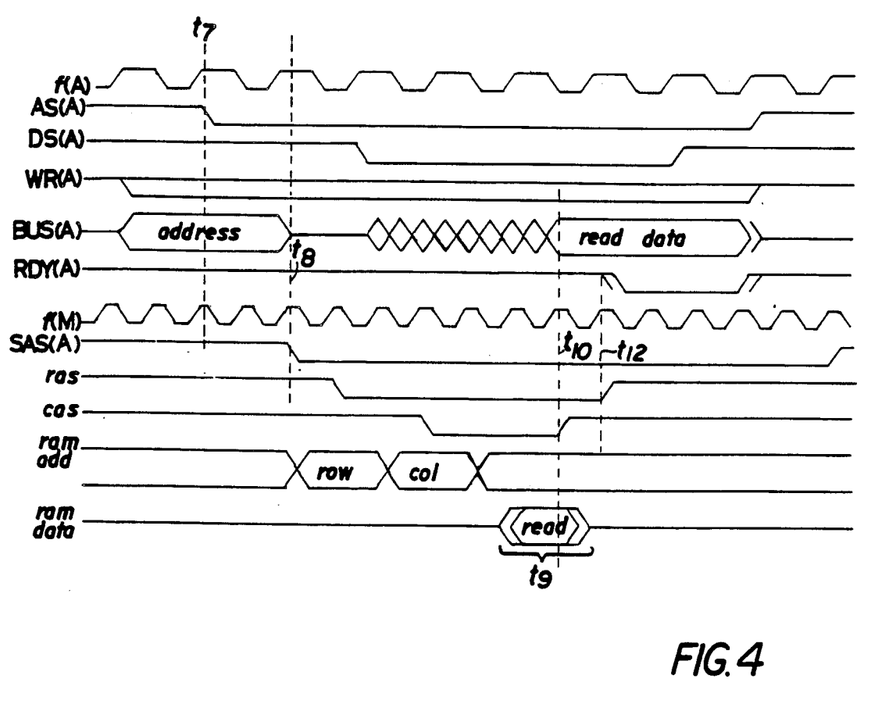
FIG. 4 is a timing diagram of corresponding signals on the processor A and memory buses.
Figure 5:
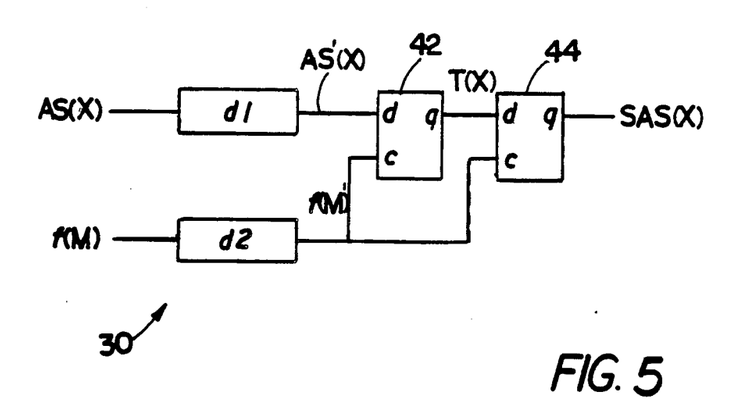
FIG. 5 is a block diagram of a dual ranked synchronizer.

Referring to FIG. 4, for example, if f(A) and f(M) are as shown and processor A issues a read request at time $t_7$, AS(A) then goes low. Thereafter, at the second subsequent rising edge of f(M) (at time $t_8$) read synchronizer 24 drives the synchronized address strobe A line, SAS(A), low to start the read cycle from RAM 12. Note that $t_8$ is synchronized with f(M), but not with f(A). The read data appears on the ram data line during period $t_9$; during that period, at the sixth f(M) rising clock edge following $t_8$ (i.e., at time $t_{10}$), memory switch 10 routes the read data to processor A via BUS(A). On the next f(M) clock pulse (at time $t_{12}$), the RDY(A) signal is asserted to tell processor A that the read data is available Referring to FIG. 5, in a dual ranked read sychronizer 30, for example, the signal SAS(X) is generated from a series of two flip-flops 42, 44. The input to flip flop 42 is AS'(X), a version of AS(X) (received from the Xth processor) and delayed by a delay amount d1 representing a logic delay in the memory switch between the pin receiving AS(X) and the d input to flip flop 42. Flip flops 42, 44 are clocked by f'(M), a version of f(M) delayed by delay amount d2. Delay amount $d_1$ may be relatively large, representing the delay associated with, e.g., a complex set of combinatorial logic or clocked logic.

Figure 6:
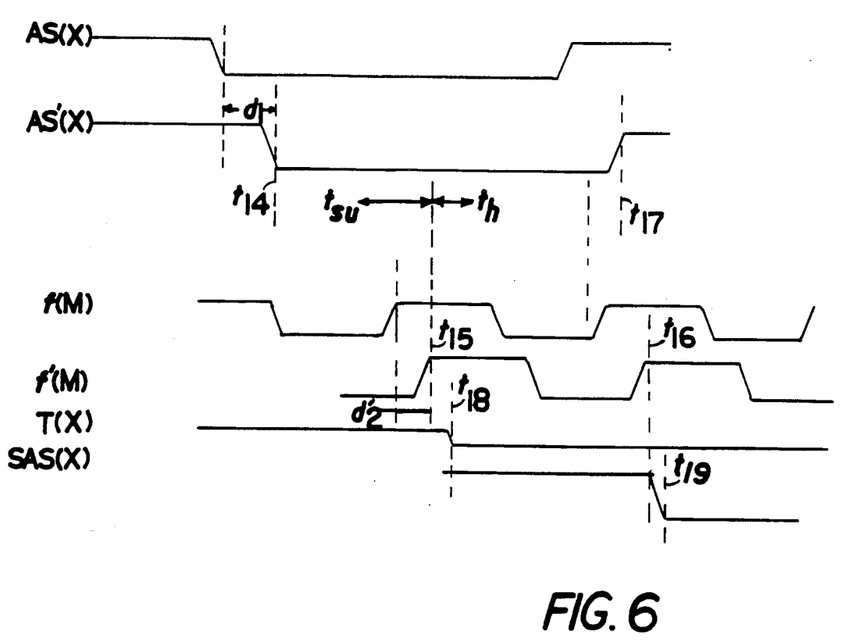
FIG. 6 is a timing chart for the dual ranked synchronizer.

Referring to FIG. 6, in general, in a dual ranked synchronizer, after AS'(X) goes low (at time $t_{14}$) at the d input of flip-flop 42, the next rising edge of f'(M) appearing at the c input of flip-flop 42 (at time $t_{15}$) will cause the output q, T(X), of flip-flop 42 to go low (at time $t_{18}$). The next rising edge of f'(M) appearing at the c input of flip-flop 44 (at time $t_{16}$) will cause the SAS(X) signal to go low at time $t_{19}$. (SAS(X) is thus synchronized with f'(M). Because of delays $d_1$ and $d_2$, the edges of f'(M) and AS'(X) lag f(M) and AS(X), respectively, as shown.

Flip-flop 42 is subject to so-called set-up and hold time requirements, identified as $t_{us}$ and $t_h$, which result from the physical characteristics of the circuit elements that make up the flip-flop. If the set-up and hold time requirements are not met, the flip-flop may enter a metastable state. Consequently, the output SAS(X) will be unpredictable (it could either have the desired falling edge or not) after the next clock edge at $t_{16}$. Note that even if the first rising edge of f'(M) occurs too early to trigger a predictable output, the next rising edge of f'(M) will clock the low level into flip-flop 42. Thus the synchronizer will work correctly in the sense of triggering a synchronized SAS(X) edge in response to the input AS'(X) edge, but the SAS(X) edge will not predictably occur at time $t_{19}$.

The same potential problem also exists with respect to the rising edge of AS'(X) at time $t_{17}$. Thus, unless edges $t_{14}$ and $t_{17}$ both have the proper relationship to the edges of f'(M), one or both of the corresponding outputs of the synchronizer will be unpredictable.

Conventional circuit testing techniques which test the output signals produced at specific times against expected values are not effective to test a device such as memory switch 10 in a mode in which its output signals are unpredictable.

Not only are the outputs of each synchronizer unpredictable for given inputs from each processor, but the outputs of the memory switch will depend on the relative activities of all three processors. Thus the theoretically ideal tester for memory switch 19 would be required to generate asynchronous test streams on each of the four buses 14, 18, each clocked independently, and to make rapid, independent branch decisions with respect to all four streams.

Even if a tester were capable of simulating three simultaneous read requests by the three processors using the signals represented on FIG. 2, the unpredictability of the output of three read synchronizers would make it impossible to predict which processor's read request would appear on bus 18 let alone exactly when the corresponding ram cycle would begin.

In accordance with the invention, in order to test a chip such as memory switch 10, a two-stage test is performed: a functional test followed by a so-called speed path test.

The purpose of the functional test is to assure that all of the logic circuits and circuit elements and all of the interconnections among them work properly in the sense that for any given combination of inputs, the logically correct outputs are generated. In order to accomplish such testing, it is necessary to eliminate the unpredictability that arises from the relative timing relationship as described above.

The unpredictability as to a given input signal (e.g., AS(X)) for a particular synchronizer may be removed by adjusting either or both the f(M) clock edges or the positions of the AS(X) edges so that the set up and hold requirements of the synchronizers are satisfied. Of course there may be potentially a large number of possible input signals and a relatively large number of synchronizers; in order to assure predictability of all outputs, the timing of the edges of f'(M) and of all of the input edges must be adjusted.

Figure 7:
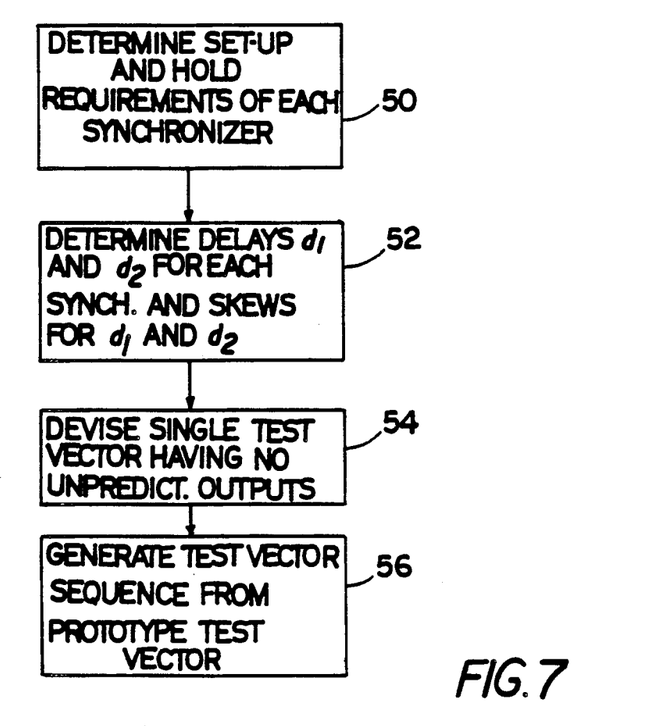
FIG. 7 is a flow diagram of the generation of test vector sequences.

Referring to FIG. 7, the procedure for doing this is as follows. First, by simulation analysis, the worst case set up and hold requirements $t_{su}$ and $t_h$ of each synchronizer are determined (50). Next, also by simulation analysis, the delays $d_1$ and $d_2$ and skews for $d_1$ and $d_2$ are also determined (52). In both cases, the simulation analysis may be performed using a commercially available simulation program, e.g., SPICE (available from University of California, Berkeley).

A single prototype test vector is then devices (54) based on a test vector period that is one period of the fastest signal required. That fastest signal may, for example, correspond to the period of f(M). Within the period of the prototype test vector, edges of all input signals required for testing are placed at positions such that, when the period of f(M) is stretched sufficiently, none of the edges will produce unpredictable results in any of the synchronizers.

Figure 8:
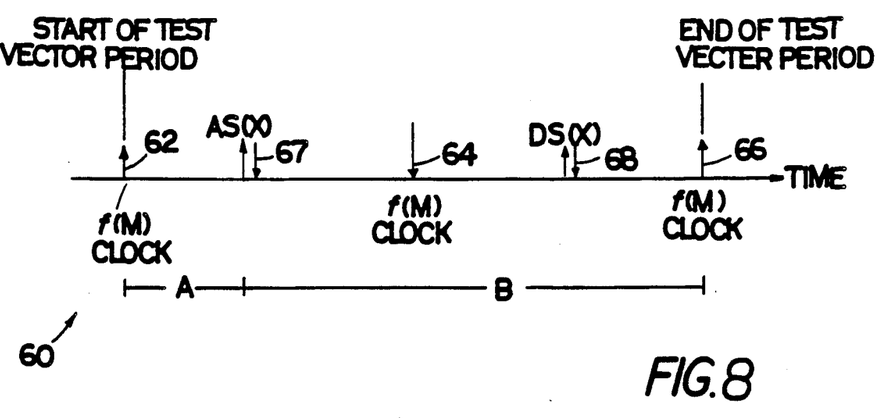
FIG. 8 is a chart of representative signal edges of a prototype test vector.

Referring to FIG. 8, in one example of the prototype test vector timing 60, the rising edge 62 of the f(M) clock appears at the start of the vector, the falling edge 64 appears in the middle, and the next rising edge 66 at the end. In the present example, the rising or falling edges 67 of AS(X) are positioned such that, after taking account of the delays $d_1$ and $d_2$, both edges of AS'(X) will fall, relative to edges of f'(M) and the setup and hold requirements, at times such that the synchronizer output will be predictable. For example, if AS(X) is synchronized to the rising edge of f'(M), then the time periods A and B must be sufficiently long. The process is repeated for all edges that must be tested. In order to achieve that result for all edges that must be placed on the prototype test vector (which will include effectively all possible input signal edges), it may be necessary to increase the period (i.e., decrease the rate) of f(M) substantially. The task of generating the prototype test vector may be performed manually. FIG. 8 is a very simple example because it involves only four edges (AS(X) and DS(X), rising and falling) and one clock (f(M)). Some chips may have several clocks; and edges may at different times be synchronized to different clocks; the edges thus must be placed in the prototype vector at locations that will avoid synchronization problems with more than one of the clocks. In practice, the resulting prototype vector may have a large number of (e.g., more than 20) edge positions within the vector.

Also note that all signal edges that are required for a test, even those for which there is no synchronization problem, must be included in the prototype vector. In order to reduce the problem of programming the tester for such a large number of edges, the period of the prototype test vector may be stretched further and the edge positions adjusted so that all edges lie only on the quarter-periods of the full test vector period, thus reducing the number of edge positions from, e.g., more than 20 to only four.

Referring again to FIG. 7, next an actual test vector sequence is generated (56) based on the prototype vector sequence.

The actual functional test vector sequence may be based on a logical test vector sequence of the type normally used to test all of the functions of the device, with the timing of the edges within each test vector governed by the timing of the edges in the prototype test vector. In this way the entire functional test sequence may be performed without any unpredictable synchronizer outputs.

For example, a test vector whose only task is to deliver an address strobe AS(A) would include only the AS(A) clock edge at the position defined by the prototype test vector, plus the edges of f(M).

The test vectors are delivered by a conventional tester of the kind that is able to position signal edges at specified times within the test vector period. It is operated at a test vector rate such that f(M) is slow enough to meet the requirements for predictability represented by the prototype vector. That rate is used for all test vectors even though with respect to some of the vectors no synchronizer is involved and it would be possible to operate at full speed. Although the complete test sequence is slowed down significantly, the functional features of the device are fully tested.

The second testing stage, speed path testing, is intended to exercise each so-called speed path in the device at its maximum intended speed. This will identify faults that may not have been found in the slower speed functional test.

A speed path may be thought of as a portion of a chip that may be operated (and therefore) tested at its full specified speed, without requiring other portions of the chip to be operated at specified speed.

For example, referring again to FIG. 2, a read access by processor A to the RAM could be tested at full speed, while processor B and C were inactive. Later a write acess by processor B could be tested at full speed, with processor A and C inactive; and so on. A different timing set-up may be devised for each test.

Figure 9:
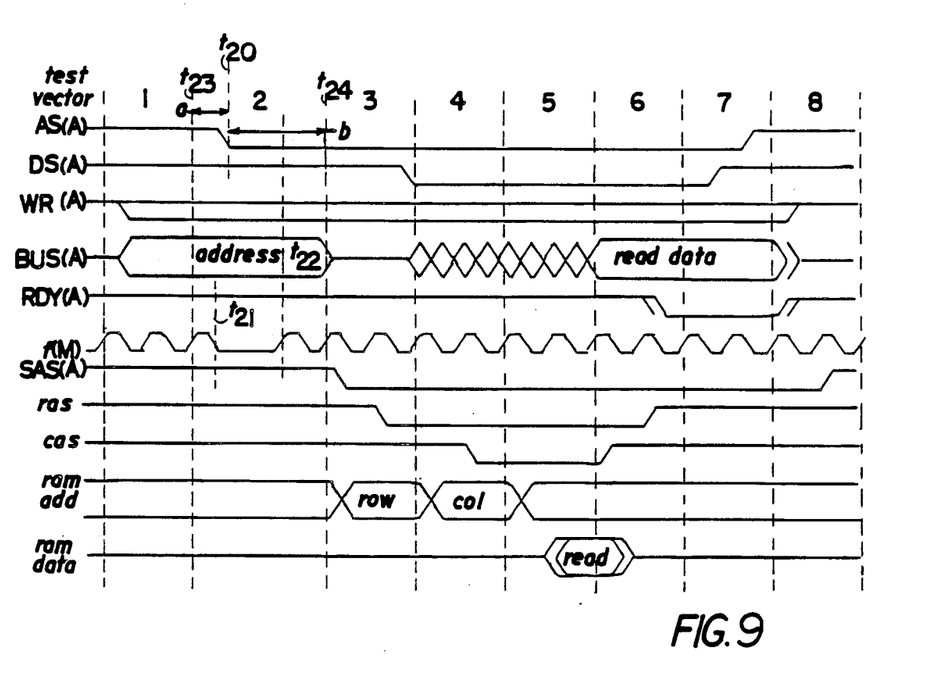
FIG. 9 is a timing chart of a speed path test.

For example, referring to FIG. 9, in a test of processor's A read cycle, a series of test vectors 1, 2, ..., 8 are used All of the vectors (except vector 2) can be run at the full specification speed, (e.g., with the period of each vector equal to twice the specification speed of clock f(M)) because there are no synchronization events in any of the time periods covered by those vectors. In fact, the only possible synchronization event occurs in vector 2 where SAS(A) must be synchronized to f(M) after the falling edge of ASA(A) appears at $t_{20}$. To accommodate that event, vector 2 is given a longer period by stretching the duration of the low level of clock f(M) between the falling edge at $t_{21}$ and the subsequent rising edge at $t_{22}$. The vector is stretched long enough to assure that the period from $t_{23}$ to $t_{20}$ and the period from $t_{20}$ to $t_{22}$ do not violate the set up and hold requirements. Vector 2 could simply be stretched to the length of the prototype vector, but vector 2 would likely be longer than necessary, because the prototype accommodates other synchronization events besides the one of concern here. A shorter vector 2 could be devised by taking account of only that one synchronization event.

For testing a write access, possibly a vector other than vector 2 would need to be extended.

Note that a speed path may only be accessable by sending the vectors via a control path that leads to the speed path and observing the results via an observation path that leads from the speed path. In that case, the vectors can be clocked through the control and observation paths at the slow functional test rate and through the speed path at the full rate (except for any vector, like vector 2 in FIG. 9, which must be stretched).

The combination of functional testing and speed path testing fully tests the chip, except for the synchronizers themselves and a small amount of arbitration logic.

Figure 10:
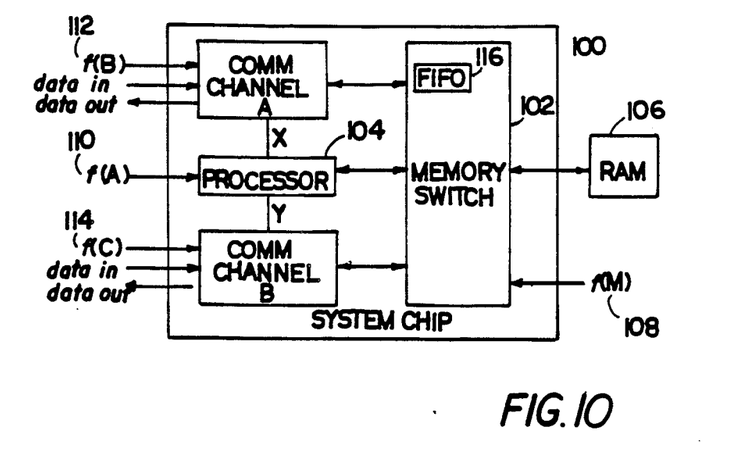
FIG. 10 is a block diagram of a chip to be tested.

More complex circuits may also be tested using the same techniques. Referring to FIG. 10, for example, a more complex system chip 100 to be tested could include a memory switch 102 (of a kind similar to the one described above), a pair of communication channels A and B, and a processor 104. Channels A and B and processor 104 are respectively connected to the three input ports of memory switch 102. Processor 104 observes the status and coordinates the activities of channels A and B via bases x and y. Channels A and B provide memory access paths to RAM 106. Clock sources 108, 110, 112, 114 provide clocks at frequencies f(M), f(A), f(B), and f(C), respectively to switch 102 (memory switch), processor 104, and channels A and B.

In addition to the test signals required to be provided by the tester for the memory switch section alone, the tester would have to be able to provide three additional clock sources (a total of four).

For functional testing, the problem of providing the additional clock sources can be treated as part of the process of adjusting timing edges to generate a prototype test vector with predictable results as explained above. The process of satisfying the synchronizer set up and hold times is more complex but the technique is the same.

In speed path testing, when one speed path is being tested at full speed, all other sections of the chip are idle or are playing a supporting role.

As an example of such a supporting role, consider the case in which communication channel A is transferring data into the RAM. This requires two clocks, f(B) to clock data from channel A to the memory switch, and f(M) to clock data from the memory switch to the RAM. There are two speed paths to be tested: channel A, and the memory switch, and they are linked by some type of synchronization logic, e.g., a FIFO buffer 116. The first speed test operates communication channel A at full speed while the memory switch 102 provides a supporting role at a slower than full speed (to pass the test results to the output pins of the switch). In the second speed test, the switch is operated at full speed and the communication channel at a slower than full speed. In either test the speed of the supporting section must satisfy two requirements. First, it must be at a rate that matches the throughput rate of the speed path being tested. Second, it must be at a rate relative to the speed path test rate that can be implemented on the tester being used.

As an example of the first requirement, throughput matching, note that the bandwidth of memory switch 102 is typically at least as large as the sum of the bandwidths of each of the two channels A and B and processor 104 that feed it. The speed path test can take advantage of this feature in the following way. Suppose the serial data rate for each channel is 16 MHz and f(B)=f(C)=32 MHz, twice the serial data rate. If the bus between each channel and the switch is 16 bits wide, the communication word rate is 1 M words/sec. Suppose the processor must communicate with the switch at a rate of 0.05 M words/sec. Then the switch must be capable of a total data transfer rate of 2.05 M words/sec. If the switch must break each RAM access cycle into 12 parts, then f(M) must be 12×2.05 =24.6 MHz. To test channel A, it is clocked at f(B)=32 MHz while the memory switch is clocked at f(M)=16 MHz, lower than its specified rate, but high enough to keep up with the output data rate of channel A; thus the first requirement is met. Because f(B) and f(M) are harmonically related, the tester can provide both clocks simultaneously, to satisfy the second requirement.

Figure 11:
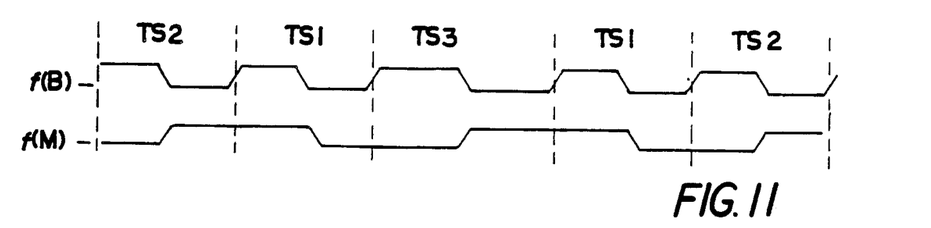
FIG. 11 is a timing chart illustrating unequal fill/empty rates.

Recall that for memory switch 102 there will be a synchronizer uncertainty associated with a memory write operation in one of the clock cycles of f(M), unless at 16 MHz f(M) has already been slowed sufficiently to avoid any uncertainty. Referring to FIG. 11, assuming the uncertainty has not been eliminated, one of the vectors, e.g., vector 3, during the speed test must be stretched as shown, much in the same manner as the stretching discussed for FIG. 9.

When a FIFO buffer 116 is the buffering device between, e.g., the communication channel A and switch 102, another technique may be used to perform the speed test. First, using a set of vectors at the functional test speed, FIFO 116 is loaded half full. Then the FIFO is both filled and emptied at the same rate without regard to synchronizer unpredictability. The memory switch rate is chosen so that both it and the communication channel clock rate are subharmonics of a common frequency, so that the FIFO empty rate equals the FIFO fill rate. For example, if 32 cycles of the f(B) clock are required to load a word from communication channel A into the FIFO, and if 12 cycles of the f(M) clock are required to unload a word from the FIFO, then the f(B) and f(M) clock rates must have an 8/3 ratio. The unpredictable results produced by the synchronizers inside the chip are unimportant because the results produced at the output pins of chip 100 are always predictable. The communication channel knows how many words have been put into the FIFO at any time and the memory switch knows how many words have been taken out of the FIFO at any time, even though neither knows how many words are in the FIFO at any time (because the exact number will vary slightly over time depending on unpredictable synchronizer outputs). The length (or elasticity) of the FIFO offers some opportunity, at least for brief periods, to operate at slightly unequal fill and empty rates in order to satisfy the constraints of the tester to implement different clock frequencies.

In another technique that makes use of the FIFO, the communication channel A is run at full speed for a short burst, loading the FIFO full without unloading it; then the FIFO is emptied by the memory switch at its full speed while the communication channel A is kept idle. Thus, the already available FIFO first serves as a sink for vector outputs and then as a source of vector inputs.

As illustrated in FIG. 9, the memory switch 10 and processor A of FIG. 1 may be tested at full speed at the same time, provided that test vector 2 be stretched to eliminate any synchronizer unpredictability. It may then be said that the timing constraints of the synchronizer unpredictability of processor A has been overlaid on the full speed f(M) clock of the memory switch and the f(M) clock has been stretched in one vector accordingly.

Figure 12:
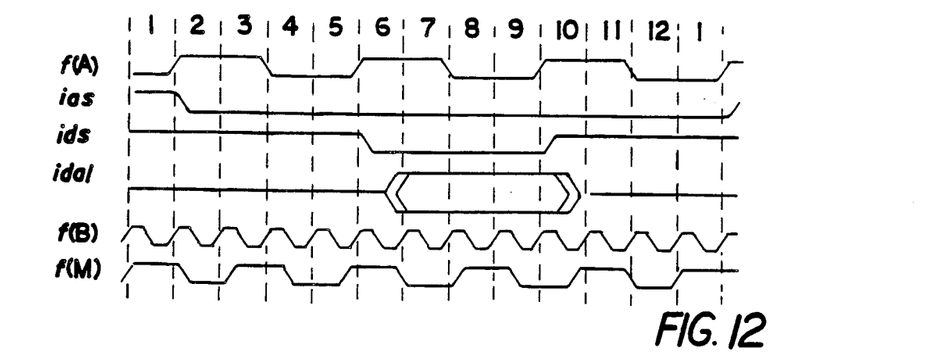
FIG. 12 is a timing chart illustrating timing overlay.
Figure 13:
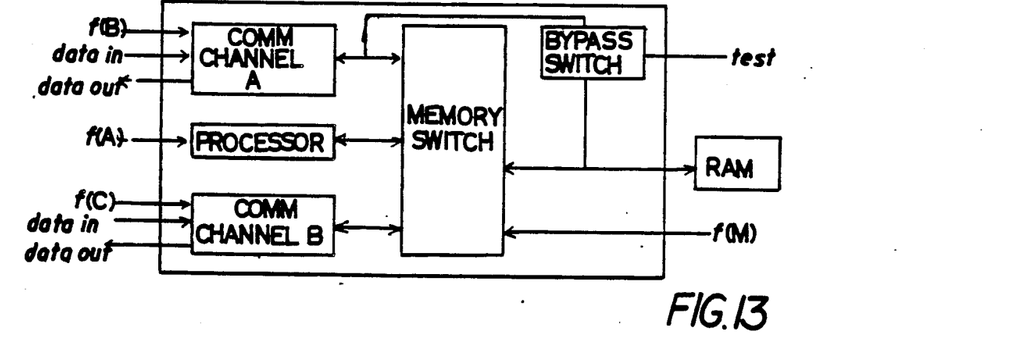
FIG. 13 is a block diagram of a bypass switch technique.

This overlay approach can be used in choosing the rate at which to clock a portion of the chip that is providing a supporting function (control or observation) with respect to a speed path test of another portion. For example, in FIG. 10, a speed path test of a transfer from communication channel A to memory switch 102 requires support functions to be performed by processor 104. Referring to FIG. 12, f(M) and f(B) are subharmonics of a common frequency and ias, ids, and idal are internal bus signals between processor 104 and channel A. To avoid synchronizer unpredictability, processor 104 is clocked at a slow speed using functional test vectors, but in overlaying f(A) on f(B) and f(M), the precise rate of f(A) is adjusted slightly to be an exact multiple of f(B), the test vector rate. This both accommodates the test to the frequency limitations of the tester, and allows easy small adjustments of f(B) to be made without requiring any recomputation of what f(A) ought to be, by simply tying f(A) to f(B).

Where a section of a chip may function over a range of clock frequencies, e.g., 10–20 MHz, testing may require overlaying several different speed tests, e.g., 10 MHz, 15 MHz, 20 MHz, over the f(M) clock. For each other test rate that may required, a new overlay would have to be done. Referring to FIG. 13, alternatively a bypass multiplexer switch could be used at test time to route data directly from the output of, e.g., communication channel A, to the output pins of the chip, giving the tester direct access to that data. This allows the development of a single set of test vectors and timing that may be swept across the entire range of operating frequencies for channel A without regard to the timing of the memory switch.

Test Vector Generation

Figure 14:
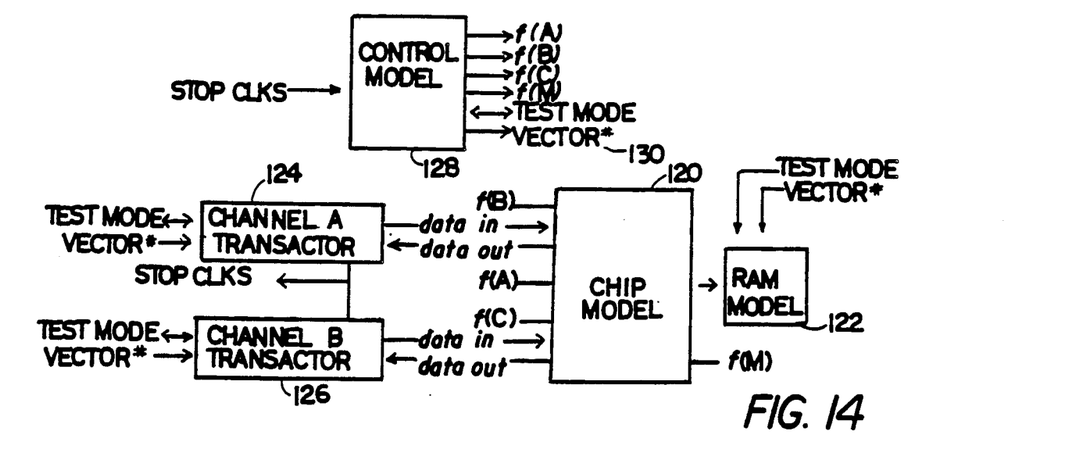
FIG. 14 is a block diagram of simulation models.

Referring to FIG. 14, in the example of FIG. 10, the process of generating test vectors to carry out the invention begins with a software simulation model 120 of the chip 100. Model 120 is typical of models generated to aid in designing the chip. Transactor models 124, 126 are also written for simulating the delivery of data over the bus connected to the chip model, and a RAM model 122 is written for simulating the receipt and verification of data delivered over the bus connected to the chip 120.

Each of the transactors and RAM models 122, 124, 126 is able to run user specified test vector algorithms in order to generate desired sequences of logical test vectors, in the usual way. But in order to implement the invention, each transactor and RAM model can simulate the delivery of test vectors in several different modes corresponding to different bus interface timing scenarios. The choice of which mode to apply depends on the value of a test mode variable, there being a unique value for each of the test timing configurations for the functional and speed path tests.

The set of simulation models 120, 122, 124, 126 is cadenced through a succession of test vector cycles each of which results in information (a trace) that can be easily converted (by conventional software) to an actual test vector on a tester. The successive test vector cycles are triggered by a vector # signal 130 generated by a control model 128 and delivered to the three models 122, 124, 126 to coordinate their activities. The control model 128 also generates the four clocks f(A), f(B), f(C), and f(M).

To generate functional test vectors, the test mode is set to a constant value associated with the timing scenario encompassed by the prototype test vector. Each model 122, 124, 126, then generates successive test vector values in accordance with its functional test algorithm and with timing consistent with the prototype test vector.

For speed path testing, of course, many variations of timing mode may be required. For a given speed path test, one of the models 122, 124, 126 will serve as a timing master and it will select and control the vector mode value. For example, for a speed path test of communication channel A, the channel A transactor 124 would be the timing master. The other models 122, 126, 128 will receive the specified vector mode value and will use a set of timing routines that will assure that those other models will play the correct role in support of the full speed path test. Furthermore, the channel A transactor may include with the vector mode value a number indicating the index of the test vector within the sequence of the particular test. In FIG. 9, for example, transactor A would issue a new index for each vector 1 through 8 of the test.

During testing, it may be necessary (to avoid synchronization uncertainties) for one of the models other than the timing master to request an adjustment of the clock rate. This may be accomplished by clock stuttering or clock suppression.

In clock suppression, for each of the four clock signals generated by control model 128, there is a control signal line (not shown) which can be used to alter the clock's timing. The control signal line is shared in common (in a wired OR arrangement) by all models that use the associated clock signal. Thus any of the models can assert the control signal line by pulling down on the line. Because each model is aware of the model mode variable and the vector number, it knows the timing context of each test vector and therefore is able to predict when a sychronizer uncertainty will occur in its timing path. The model will pull down the wired OR line one test vector prior to the vector in which the synchronizer uncertainty is expected to occur. The control model will then simply suppress the clock edge in the next vector, thus avoiding the synchronizer uncertainty.

In clock stuttering, avoidance of synchronizer uncertainty is built into the test modes. The program that translates the trace file into the actual test vectors also maps the test mode into the selection and control of the tester's timing resources. The timing controls are called timing sets. The available information on synchronizer uncertainties generated by the models may be used by the mapping program, for example by stretching the clock timing for any vector that involves a predicted synchronizer uncertainty. The stretching of the clock, as illustrated in FIG. 9, vector 2, is called clock stuttering.

Other embodiments are within the following claims.

I claim:

1. A method of testing a digital circuit of a kind that is intended (a) to be clocked at least at one prespecified rate, (b) to receive input signals that are possibly unsynchronized with said clock, and (c) to generate corresponding signals that are synchronized with said clock, and wherein said synchronized signals may be unpredictable, said testing comprising clocking said digital circuit at a rate that is slower than said prespecified rate, and applying to said circuit test vectors corresponding to said input signals at times such that said synchronized signals will be predictable.

2. A method of testing a digital circuit of a kind that is intended to be clocked at least at one prespecified rate, said circuit including signal paths each capable of receiving input signals and delivering corresponding output signals, some of said signal paths producing unpredictable output signals when said digital circuit is clocked at said prespecified rate, said method comprising clocking, at said prespecified rate, each said signal path that is capable of being tested at said prespecified rate with predictable results, while applying to the terminals of said circuit a sequence of test vectors that is insufficient to fully test all of the functions of said circuit but is sufficient to test each signal path of said circuit.

3. The method of claim 1 wherein said circuit includes signal paths each capable of receiving input signals and delivering corresponding output signals, some of said signal paths producing unpredictable output signals when said digital circuit is clocked at said prespecified rate, said method further comprising clocking, at said prespecified rate, each said signal path that is capable of being tested at said prespecified rate with predictable results, while applying to the terminals of said circuit a sequence of test vectors that is insufficient to fully test all functions of said circuit but is sufficient to test each signal path that is defined by said circuit.

4. The method of claim 1 or 3 wherein the unpredictability of said synchronized signals arises from setup and hold time requirements of said circuit and said test vectors include signals whose timing is chosen to satisfy said set up and hold times.

5. The method of claim 1 or 3 wherein all said test vectors are derived from a single prototype vector which defines the timing of all said input signals relative to said slower clocking rate in such a way that said synchronized signals will all be predictable if said test vectors are delivered at a predetermined rate.

6. The method of claim 5 wherein each said test vector comprises at least some of said input signals appearing at times defined by said prototype vector.

7. The method of claim 2 or 3 wherein during said test of said signal path at said prespecified rate, said rate is temporarily slowed during one or more time segments.

8. The method of claim 7 wherein said rate is slowed by suppressing a clock tick.

9. The method of claim 7 wherein said rate is slowed by a technique other than suppressing a clock tick.

10. The method of claim 2 or 3 wherein testing at least some said signal paths requires simultaneously exercising other said signal paths and said method comprises clocking said other signal paths at a rate slower than said prespecified rate.

11. The method of claim 10 wherein said signal paths are linked by a buffering circuit that enables one said signal path to feed data to said buffer asynchronously with the rate at which data is retrieved from said buffer by the other said signal path, and wherein said method includes controlling said slower rate relatively to said prespecified rate based on the characteristics of said buffer.

12. The method of claim 11 wherein said buffer is filled and emptied at unequal rates.

13. The method of claim 12 wherein said slower rate is slowed further in selected segments of said test to assure predictability.

14. The method of claim 11 wherein said buffer is filled and emptied at equal rates.

15. The method of claim 11 wherein said buffer is alternately filled by one said signal path at its prespecified speed and emptied by the other said signal path at its prespecified speed.

16. The method of claim 11 wherein said slower speed and said prespecified speed are harmonically related.

17. The method of claim 1, 2, or 3 wherein said circuit comprises an integrated circuit.

18. The method of claim 1 or 3 wherein said circuit comprises a plurality of synchronizers that receive said input signals and generate said corresponding signals, and wherein said input signals for different said synchronizers are asynchronous with respect to one another.

19. A method of testing a digital circuit of a kind that is intended (a) to be clocked at least at one prespecified rate, (b) to receive input signals that re possibly unsynchronized with said clock, and (c) to generate corresponding signals that are synchronized with said clock, wherein said synchronized signals may appear at times which are unpredictable, said method comprising clocking said digital circuit at a rate that is slower than said prespecified rate, applying to said circuit test vectors corresponding to said input signals at times such that said synchronized signals will be predictable, wherein the unpredictability of said synchronized signals arises from setup and hold time requirements of said circuit, and said test vectors include signals whose timing is chosen to satisfy said setup and hold times, wherein all said test vectors are derived from a single prototype vector which defines the timing of all said input signals relative to said slower clocking rate in such a way that said unsynchronized signals will all be predictable if said test vectors are delivered at a predetermined rate, and wherein a plurality of synchronizers receive said input signals and generate said corresponding signals, and wherein said input signals for different said synchronizers are asynchronous with respect to one another.

20. A method of testing a digital circuit of a kind that is intended to be clocked at least at one prespecified rate, said circuit including signal paths each capable of receiving input signals and delivering output signals, some of said signal paths producing unpredictable output signals when said digital circuit is clocked at said prespecified rate, wherein test at least some said signal paths requires simultaneously exercising other said signal paths, said method comprising clocking, at said prespecified rate, each said signal path that is capable of being tested at said prespecified rate with predictable results, while applying to the terminals of said circuit a sequence of test vectors that is insufficient to fully test all functions of said circuit but is sufficient to test each signal path that is defined by said circuit, wherein during said test of said signal paths at said prespecified rate, said rate is temporarily slowed during one or more time segments, and wherein said other signal paths are clocked at a rate slower than said prespecified rate.

21. Apparatus for testing a digital circuit of a kind that is intended (a) to be clocked at least at one prespecified rate, (b) to receive input signals that are possibly unsynchronized with said clock, and (c) to generate corresponding signals that are synchronized with said clock, and wherein said synchronized signals may appear at times that are unpredictable, said apparatus comprising means for clocking said digital circuit at a rate that is slower than said prespecified rate, and means for applying to said circuit test vectors corresponding to said input signals at times such that said synchronized signals will be predictable.

22. Apparatus for testing a digital circuit of a kind that is intended to be clocked at least at one prespecified rate, said circuit including signal paths each capable of receiving input signals and delivering corresponding output signals, some of said signal paths producing unpredictable output signals when said digital circuit is clocked at said prespecified rate, said apparatus comprising means for clocking, at said prespecified rate, each said signal path that is capable of being tested at said prespecified rate with predictable results, and means for applying to the terminals of said circuit a sequence of test vectors that is insufficient to fully test all of the functions of said circuit but is sufficient to test each signal path of said circuit.

23. A method for generating test vectors for use in testing a digital circuit of a kind that is intended (a) to be clocked at least at one prespecified rate, (b) to receive input signals that are possibly unsynchronized with said clock, and (c) to generate corresponding signals that are synchronized with said clock, wherein said synchronized signals may be unpredictable, said method comprising providing simulation models of said digital circuit and of testing elements for delivering and receiving test signals to and from said circuit, including, in said testing element models, algorithms for generating logical test pattern sequences, running said models through a sequence of testing intervals to generate traces that are convertible into test vectors, and selecting the rates at which said test models operate to assure the predictability of test results.

24. The method of claim 23 wherein said test model rates may be varied while said models are being run.

25. The method of claim 23 wherein any said testing element model may request that the rate at which a test is running be temporarily slowed.

* * * * *

UNITED STATES PATENT AND TRADEMARK OFFICE
CERTIFICATE OF CORRECTION

PATENT NO. : 5,097,468

DATED : March 17, 1992

INVENTOR(S) : Eugene Earlie

It is certified that error appears in the above-identified patent and that said Letters Patent is hereby corrected as shown below:

Col. 1, lines 11-12, "processors" should be --processors'--.

Col. 2, line 6, after "predictability", insert a period.

Col. 2, line 27, after "tester" insert a period.

Col. 2, line 29, after "tested" insert a period.

Col. 3, line 28, after "$t_1$)" insert a period.

Col. 3, line 44, after "and C" insert a period.

Col. 4, line 4, after "available" insert a period.

Col. 4, line 24, "(SAS(X)" should be --SAS(X)--.

Col. 5, line 32, "devices" should be --devised--.

Col. 6, line 54, after "used" insert a period.

UNITED STATES PATENT AND TRADEMARK OFFICE
CERTIFICATE OF CORRECTION

PATENT NO. : 5,097,468

DATED : March 17, 1992

INVENTOR(S) : Eugene Earlie

It is certified that error appears in the above-identified patent and that said Letters Patent is hereby corrected as shown below:

Col. 10, line 40 "arranqement" should be --arrangement--.

Col. 12, claim 19, line 29, "re" should be --are--.

Signed and Sealed this

Thirteenth Day of July, 1993

Attest:

MICHAEL K. KIRK

Attesting Officer

Acting Commissioner of Patents and Trademarks